(12) United States Patent
Iwai et al.

(10) Patent No.: US 6,181,922 B1
(45) Date of Patent: *Jan. 30, 2001

(54) ATTENUATOR UNIT, STEP ATTENUATOR, AND ELECTRONIC APPARATUS

(75) Inventors: Kenji Iwai, Sapporo; Kazuhiko Kobayashi, Kawasaki, both of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/594,314

(22) Filed: Jan. 30, 1996

(30) Foreign Application Priority Data

Apr. 11, 1995 (JP) .................................................. 7-085599

(51) Int. Cl.[7] ..................................................... H04B 1/06
(52) U.S. Cl. .................. 455/249.1; 455/116; 455/241.1; 455/251.1; 455/558; 326/112; 333/81 A; 333/81 R
(58) Field of Search ............................. 455/249.1, 232.1, 455/234.1, 241.1, 246.1, 251.1, 252.1, 253.2, 116, 127, 557, 558; 526/119, 120, 112, 117; 333/81 R, 81 A

(56) References Cited

U.S. PATENT DOCUMENTS 4,518,871 * 5/1985 Toyoda et al. ........................ 326/117
4,967,169 10/1990 Sun et al. ............................. 333/78 R
5,345,123 9/1994 Staudinger et al. .................. 307/552

FOREIGN PATENT DOCUMENTS 0360916   4/1990   (EP) .
0647024   4/1995   (EP) .
5206780 * 8/1993   (JP) .

OTHER PUBLICATIONS

International Microwave Symposium, Long Beach, Jun. 13–15, 1989, Institute of Electrical and Electronics Engineers, pp. 1295–1298.

Bayruns J et al: "A Monolithic DC–1.6 GHZ Digital Attenuator" p. 1295, right hand column, line 22– line 38; figure 1.

Leonce J. Sevin, Jr.,: "Field–Effect Transistors" 1965, McGraw Hill, New York US: figure 3.16.

* cited by examiner

*Primary Examiner*—Lee Nguyen
(74) *Attorney, Agent, or Firm*—Helfgott & Karas, P.C.

(57) ABSTRACT

An attenuator unit for attenuating a signal, the unit includes a π-type attenuator having a first resistor and second and third resistors which are arranged on both sides of the first resistor, a first transistor connected in parallel with the first resistor, and a second transistor connected between a joint node of the second resistor and the third resistor and a first voltage level. In the unit, by controlling a gate voltage of the first transistor and a gate voltage of the second transistor, an attenuation value of the attenuator unit is changed.

12 Claims, 15 Drawing Sheets

ATTENUATOR UNIT, STEP ATTENUATOR, AND ELECTRONIC APPARATUS

BACKGROUND OF THE INVENTION

1. Field of the Invention

The present invention generally relates to an attenuator unit and a step attenuator, and more particularly, to an attenuator unit and a step attenuator unit which attenuate a high-frequency signal in radio equipment. The present invention is also directed to an electronic apparatus including the step attenuator.

2. Description of the Related Art

A step attenuator is an attenuator whose attenuation value can flexibly be selected at a digital value. This step attenuator is widely used for controlling transmission power of radio equipment such as a portable telephone.

FIG. 1 shows a block diagram of the radio equipment to which the step attenuator is applied. A step attenuator 6 is connected between a transmission circuit 4 and a transmission power amplifier 8. For example, when extremely large output power is transmitted from the radio equipment, the large output power may saturate a reception amplifier in radio equipment at a transmission destination, and may interfere with other radio equipment. In such a case, an attenuation value of the step attenuator 6 is selected to be large to reduce the output power of the radio equipment.

Since the step attenuator is widely used for portable apparatuses, miniaturization of the step attenuator is required. Further, for applying the step attenuator to the radio equipment, the step attenuator needs to have wide-band frequency performance.

FIG. 2 shows a typical configuration of the step attenuator. A step attenuator 20 is constructed with a plurality of (3 in this case) attenuator units 22a, 22b, 22c connected in series.

The attenuator units 22a, 22b, 22c respectively include two single-pole double-through (SPDT) switches 24a-1 and 24a-2, 24b-1 and 24b-2, 24c-1 and 24c-2, and fixed attenuators 26a, 26b, 26c. In the SPDT switches, by selecting whether passing a supplied signal through the fixed attenuator or passing the supplied signal through the other path, an attenuation value of the attenuator 22a, 22b, 22c unit can be digitally controlled.

In a typical step attenuator, when attenuation values of the fixed attenuators are properly selected, by properly switching the SPDT switches of the attenuator units, a desired attenuation value can be digitally selected. In the step attenuator 20 shown in FIG. 2, the fixed attenuator 26a of the attenuator unit 22a has an attenuation value 1 dB, the fixed attenuator 26b of the attenuator unit 22b has an attenuation value 2 dB, and the fixed attenuator 26c of the attenuator unit 22c has an attenuation value 4 dB. Therefore, a total attenuation value of the step attenuator 20 can be varied from 0 to 7 dB by a 1-dB step by switching the SPDT switches of the attenuator units.

In each attenuator unit, for the fixed attenuator, a T-type attenuator and a π-type attenuator are commonly used.

FIG. 3 shows a schematic diagram of a prior-art attenuator unit using the T-type attenuator. FIG. 4 shows a schematic diagram of a prior-art attenuator unit using the π-type attenuator.

An attenuator unit 30 shown in FIG. 3 includes three resistors R31, R32, R33 constituting the T-type attenuator, and two field-effect transistors (FETs) 32, 34 operating as switches. When the FET 32 is non-conductive and the FET 34 is conductive, the attenuator unit 30 operates as the T-type attenuator and generates a large attenuation value. On the other hand, when the FET 32 is conductive and the FET 34 is non-conductive, the attenuation value of the attenuator unit 30 becomes small.

An attenuator unit 40 shown in FIG. 4 includes three resistors R41, R42, R43 constituting the π-type attenuator, and three FETs 42, 44, 46 operating as switches. When the FET 42 is non-conductive and the FETs 44, 46 are conductive, the attenuator unit 40 operates as the π-type attenuator and generates a large attenuation value. On the other hand, when the FET 42 is conductive and the FETs 44, 46 are non-conductive, the attenuation value of the attenuator unit 40 becomes small.

In a shunt side of the attenuator unit 30 shown in FIG. 3, the FET 34 is connected, while in a shunt side of the attenuator unit 40 shown in FIG. 4, the FETs 44, 46 are connected. In this way, since the shunt side of the T-type attenuator is constructed with a single FET and is in different from the π-type attenuator, the degree to which dispersion of frequency performance of resistance in a conductive condition of the FET has an influence on the attenuator unit 30 may be smaller than that in which the dispersion has an influence on the attenuator unit 40.

However, when designing the attenuator unit 30 having the T-type attenuator to generate a large attenuation value, the resistance value in the shunt side needs to be extremely small. Such an extremely-small resistance needs a wide area and makes the design complex.

On the contrary, the attenuator unit 40 having the π-type attenuator can overcome the above-discussed problem, and, thus, the attenuator unit 40 is suitable for constructing the step attenuator.

However, the above-discussed prior-art step attenuator using the π-type attenuator has the following problems.

Since the attenuator unit 40 has two current paths in the shunt side, two FETs are required, and, thus, it is difficult to produce the step attenuator with small size and high density. As a result, the size of the step attenuator using the π-type attenuator is larger than that using the T-type attenuator.

Furthermore, the SPDT switches in the attenuator units need to be controlled to turn on and off. Namely, for the attenuator units, two signals of a control signal and an inverted control signal are required. As shown in FIG. 2, the inverted control signals can be generated by inverting the control signals in inverter circuits 28a, 28b, 28c.

FIG. 5 shows a schematic diagram of a prior-art inverter circuit. An inverter circuit 50 shown in FIG. 5 is constructed with a depletion-type FET (D-FET) 52 and an enhancement-type FET (E-FET) 54. A signal supplied to a gate of the E-FET 54 is inverted and is produced from a drain of the E-FET 54.

Since the inverter circuit 50 includes two FETs, electrical performance of the inverter circuit 50 is easily varied by dispersion in a process. Therefore, the inverter circuit 50 needs to be designed so as to absorb influences due to the dispersion.

Further, size of the two FETs is not negligible as compared with a circuit scale of the step attenuator, and, thus, the step attenuator size becomes large.

SUMMARY OF THE INVENTION

It is an object of the present invention to provide a step attenuator which can be produced with small size and high density. Further, the step attenuator may be easily designed.

Also, the cost of the step attenuator can be reduced. This permits the disadvantages described above to be eliminated.

The object described above is achieved by an attenuator unit for attenuating a signal, the unit comprising: a π-type attenuator having a first resistor and second and third resistors which are arranged on both sides of the first resistor; a first transistor connected with the first resistor in parallel; and a second transistor connected between a joint node of the second resistor and the third resistor and a first voltage level; wherein by controlling a gate voltage of the first transistor and a gate voltage of the second transistor, an attenuation value of the attenuator unit is changed.

According to the above-mentioned attenuator unit, the number of transistors in a shunt side is reduced by one as compared to a prior-art attenuator unit having two FETs. Therefore, the number of components and a layout area for the attenuator unit may be reduced, and, thus, a simply-configured attenuator unit may be realized. Furthermore, since the two FETs in the shunt side of the prior-art attenuator unit are replaced to a single FET in common, degradation of the frequency performance due to dispersion of the FET characteristics may be prevented.

In addition, when the attenuator unit mentioned above is produced by using an MMIC technique, because of reduction of chip area for the attenuator unit, design cost may be reduced. Also, since the number of chips obtainable from one wafer increases, mass production of the attenuator unit becomes possible.

In addition, when a control voltage of the control signal is selected near a pinch-off voltage of the FET, the attenuator unit may operate as a variable attenuator whose attenuation value can continuously be varied.

The object described above is also achieved by a step attenuator for attenuating a signal, having a plurality of attenuator units connected in series, at least one of the plurality of attenuator units comprising: a π-type attenuator having a first resistor and second and third resistors which are arranged on both sides of the first resistor; a first transistor connected with the first resistor in parallel; and a second transistor connected between a joint node of the second resistor and the third resistor and a first voltage level; wherein by controlling a gate voltage of the first transistor and a gate voltage of the second transistor, an attenuation value of the attenuator unit is changed.

According to the above-mentioned step attenuator, since each attenuator unit has a simple configuration, over all size of the step attenuator may be miniaturized and simplified. Further, since each attenuator unit has good frequency performance, the step attenuator according to the present invention may have better frequency performance than that of the step attenuator having the prior-art attenuator unit.

The object described above is also achieved by the step attenuator mentioned above, wherein at least one of the plurality of attenuator units further comprises an inverter circuit providing a control signal which controls one of the gate voltage of the first transistor and the gate voltage of the second transistor, the inverter circuit including: a first depletion-type FET (D-FET); a first resistor connected between a drain of the first D-FET and a first power-supply voltage; a second resistor connected between a source of the first D-FET and a second power-supply voltage; and a third resistor connected between a gate of the first D-FET and the second power-supply voltage; wherein the control signal supplied to the gate of the first D-FET is inverted, and an inverted control signal is produced from the drain of the first D-FET.

According to the above-mentioned step attenuator, the number of transistors required for the attenuator unit may be reduced as compared to the prior-art attenuator unit, and the number of transistors required for the inverter circuit may also be reduced as compared to the prior-art inverter circuit. Therefore, since the step attenuator according to the present invention uses smaller-sized and further simplified attenuator units and inverter circuits, the step attenuator may further be miniaturized and simplified as compared to the prior-art step attenuator.

Further, since the attenuator unit and the inverter circuit in the step attenuator according to the present invention has good frequency performance, the step attenuator may have better frequency performance as compared to the step attenuator having the prior-art attenuator unit and the prior-art inverter circuit.

The object described above is also achieved by a step attenuator for attenuating a signal, having at least one first attenuator unit and at least one second attenuator unit, the first attenuator unit comprising: a first π-type attenuator having a first resistor and second and third resistors which are arranged on both sides of the first resistor; a first transistor connected with the first resistor in parallel; and a second transistor connected between a joint node of the second resistor and the third resistor and a first voltage level; wherein by controlling a gate voltage of the first transistor and a gate voltage of the second transistor, a first attenuation value of the first attenuator unit is changed; and the second attenuator unit comprising: a second π-type attenuator having a fourth resistor and fifth and sixth resistors which are arranged on both sides of the fourth resistor; a third transistor connected with the fourth resistor in parallel; a fourth transistor connected between the fifth resistor and a first voltage level; and a fifth transistor connected between the sixth resistor and the first voltage level; wherein: by controlling a gate voltage of the third transistor, a gate voltage of the fourth transistor, and a gate voltage of the fifth transistor, a second attenuation value of the second attenuator unit is changed; and the first attenuation value of the first attenuator unit is less than the second attenuation value of the second attenuator unit.

According to the above-mentioned step attenuator, for an attenuator unit having a relatively large attenuation value, the prior-art attenuator unit having two FETs may be used for obtaining good attenuation performance, and for attenuator units having a relatively small attenuation value, the attenuator unit having a single FET is used for miniaturizing step-attenuator size.

Therefore, the above-mentioned step attenuator according to the present invention may be miniaturized and may have good attenuation performance even for the relatively large attenuation value.

The object described above is also achieved by an inverter circuit comprising: a first depletion-type FET (D-FET); a first resistor connected between a drain of the first D-FET and a first power-supply voltage; a second resistor connected between a source of the first D-FET and a second power-supply voltage; and a third resistor connected between a gate of the first D-FET and the second power-supply voltage; wherein a signal supplied to the gate of the first D-FET is inverted, and an inverted signal is produced from the drain of the first D-FET.

According to the above-mentioned inverter circuit, even with the configuration having a single FET, the inverter circuit may be realized. Therefore, the inverter circuit according to the present invention may be miniaturized as compared to the prior-art inverter circuit having two FETS. Further, inverter-circuit design may also be simplified, and, thus, inverter-circuit cost can be reduced.

The object described above is also achieved by an amplifier module having a step attenuator attenuating a signal and an amplifier connected to the step attenuator, the step attenuator including a plurality of attenuator units connected in series, at least one of the plurality of attenuator units comprising: a π-type attenuator having a first resistor and second and third resistors which are arranged on both sides of the first resistor; a first transistor connected with the first resistor in parallel; and a second transistor connected between a joint node of the second resistor and the third resistor and a first voltage level; wherein by controlling a gate voltage of the first transistor and a gate voltage of the second transistor, an attenuation value of the attenuator unit is changed.

According to the above-mentioned amplifier module, the smaller-sized and simplified step attenuator mentioned above is used. Therefore, the amplifier module may also be further miniaturized and simplified.

The object described above is also achieved by a transmitter module having a transmission circuit for producing a transmission signal, a step attenuator attenuating the transmission signal and an amplifier amplifying the transmission signal transmitted from the step attenuator, the step attenuator including a plurality of attenuator units connected in series, at least one of the plurality of attenuator units comprising: a π-type attenuator having a first resistor and second and third resistors which are arranged on both sides of the first resistor; a first transistor connected with the first resistor in parallel; and a second transistor connected between a joint node of the second resistor and the third resistor and a first voltage level; wherein by controlling a gate voltage of the first transistor and a gate voltage of the second transistor, an attenuation value of the attenuator unit is changed.

According to the above-mentioned transmitter module, the smaller-sized and simplified step attenuator mentioned above is used. Therefore, the transmitter module may also be further miniaturized and simplified. Also, cost reduction of the transmitter module is expected.

The object described above is also achieved by a receiver module having a step attenuator attenuating a received signal, a reception amplifier, and a reception circuit receiving an amplified received signal, the step attenuator including a plurality of attenuator units connected in series, at least one of the plurality of attenuator units comprising: a π-type attenuator having a first resistor and second and third resistors which are arranged on both sides of the first resistor; a first transistor connected with the first resistor in parallel; and a second transistor connected between a joint node of the second resistor and the third resistor and a first voltage level; wherein by controlling a gate voltage of the first transistor and a gate voltage of the second transistor, an attenuation value of the attenuator unit is changed.

According to the above-mentioned receiver module, the smaller-sized and simplified step attenuator mentioned above is used. Therefore, the receiver module may also be further miniaturized and simplified. Also, cost reduction of the receiver module is expected.

The object described above is also achieved by a wireless card including a data processing part for processing data, a modulation-and-demodulation part, a high-frequency part having a transmission circuit and a reception circuit and at least one step attenuator, and an antenna, the wireless card being provided to a data processing apparatus to communicate the data with another apparatus, the step attenuator including a plurality of attenuator units connected in series, at least one of the plurality of attenuator units comprising: a π-type attenuator having a first resistor and second and third resistors which are arranged on both sides of the first resistor; a first transistor connected with the first resistor in parallel; and a second transistor connected between a joint node of the second resistor and the third resistor and a first voltage level; wherein by controlling a gate voltage of the first transistor and a gate voltage of the second transistor, an attenuation value of the attenuator unit is changed.

According to the above-mentioned wireless card, the smaller-sized and simplified step attenuator mentioned above is used, miniaturization of the wireless card may easily be performed. Therefore, in the data processing apparatus such as a personal computer, the space required for the wireless card to be inserted may be reduced, and, thus, a smaller-sized personal computer capable of supporting the wireless card may be realized.

Other objects and further features of the present invention will be apparent from the following detailed description when read in conjunction with the accompanying drawings.

DESCRIPTION OF THE PREFERRED EMBODIMENTS

Figure 6:
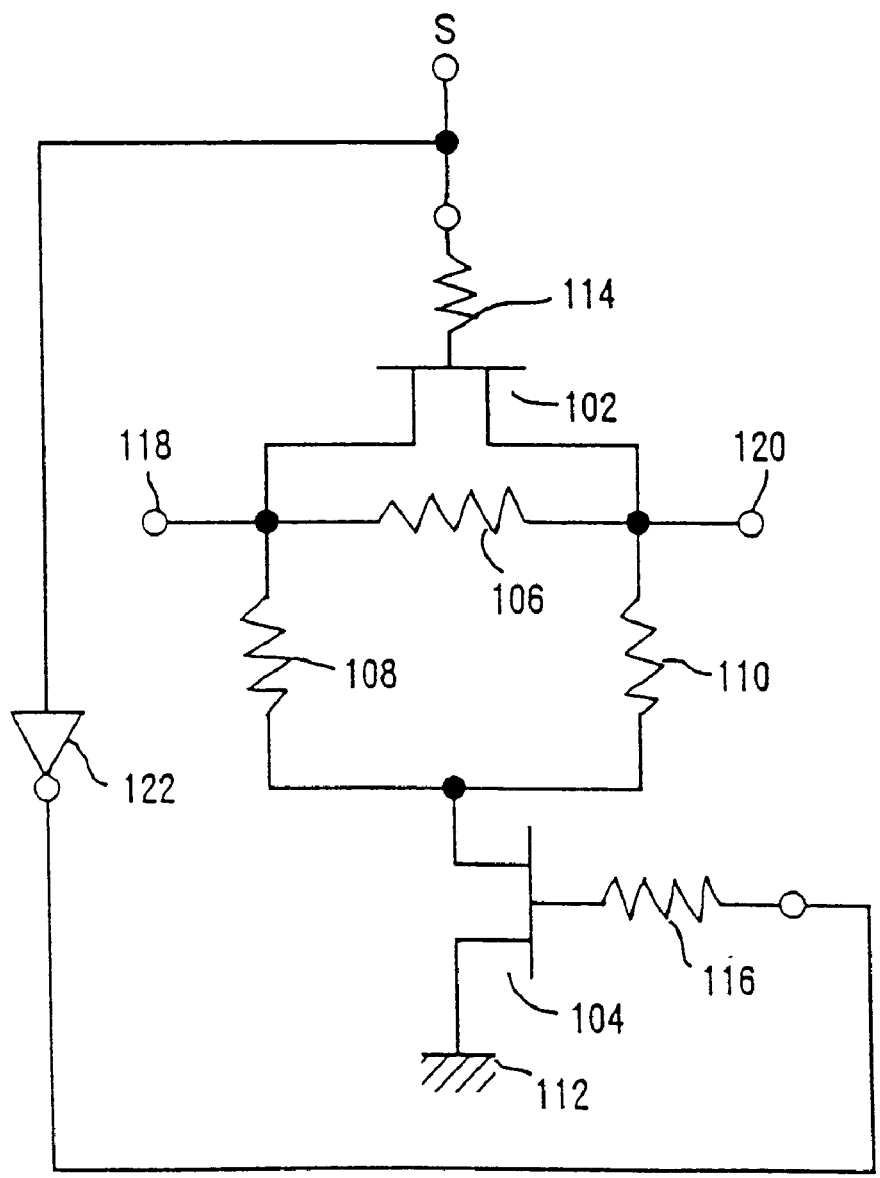
FIG. 6 shows a schematic diagram of an attenuator unit constructing a step attenuator according to the present invention.

A description will be given of a first embodiment of an step attenuator according to the present invention, by referring to FIG. 6 and FIG. 7. FIG. 6 shows a schematic diagram of an attenuator unit of the step attenuator according to the present invention. An attenuator unit 100 has a resistor 106, and resistors 108, 110 arranged on both sides of the resistor 106. These three resistors constitute a π-type attenuator having a fixed attenuation value. The attenuator unit may be used as an attenuator by itself, and a plurality of the attenuator units may be used as the step attenuator.

In the attenuator unit 100, a field-effect transistor (FET) 102 is connected to the resistor 106 in parallel. An FET 104 is connected between a joint node of the resistor 108 and the resistor 110 and a ground 112. A gate voltage of the FET 102 is controlled by an external control signal S through a resistor 114. On the other hand, a gate of the FET 104 is controlled by an inverted external control signal which is produced by inverting the external control signal S in an inverter circuit 122, through a resistor 116. A description of the inverter circuit 122 will be given in detail later.

Next, an operation of the attenuator unit 100 will be discussed.

When the FET 102 is turned off and the FET 104 is turned on by the external control signal S, the attenuator unit 100 is operative as the π-type attenuator. Therefore, a signal provided to a terminal 118 is attenuated according to an attenuation value determined by the resistors 106, 108 and 110, and an attenuated signal is produced at a terminal 120.

On the other hand, when the FET 102 is turned on and the FET 104 is turned off by the external control signal S, a path between the terminal 118 and the terminal 120 becomes conductive. Therefore, the signal provided at a terminal 118 is produced to the terminal 120 without being attenuated.

In this way, by digitally controlling the FET 102 and the FET 104, a total attenuation value throughout the path between the terminal 118 and the terminal 120 may be set by a given step.

Figure 1:
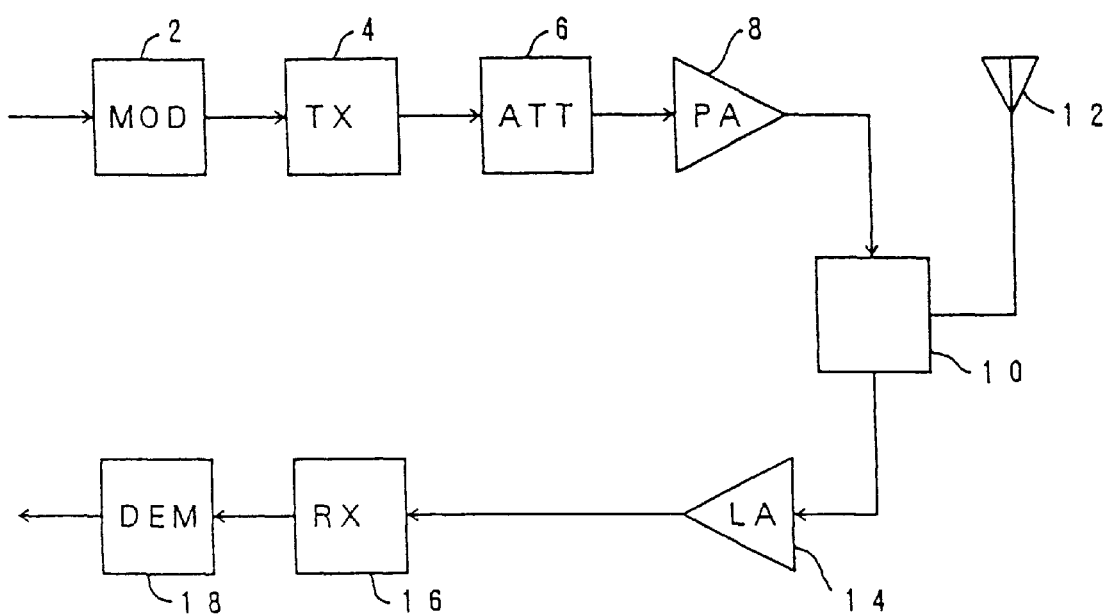
FIG. 1 shows a block diagram of radio equipment to which a step attenuator is applied.
Figure 2:
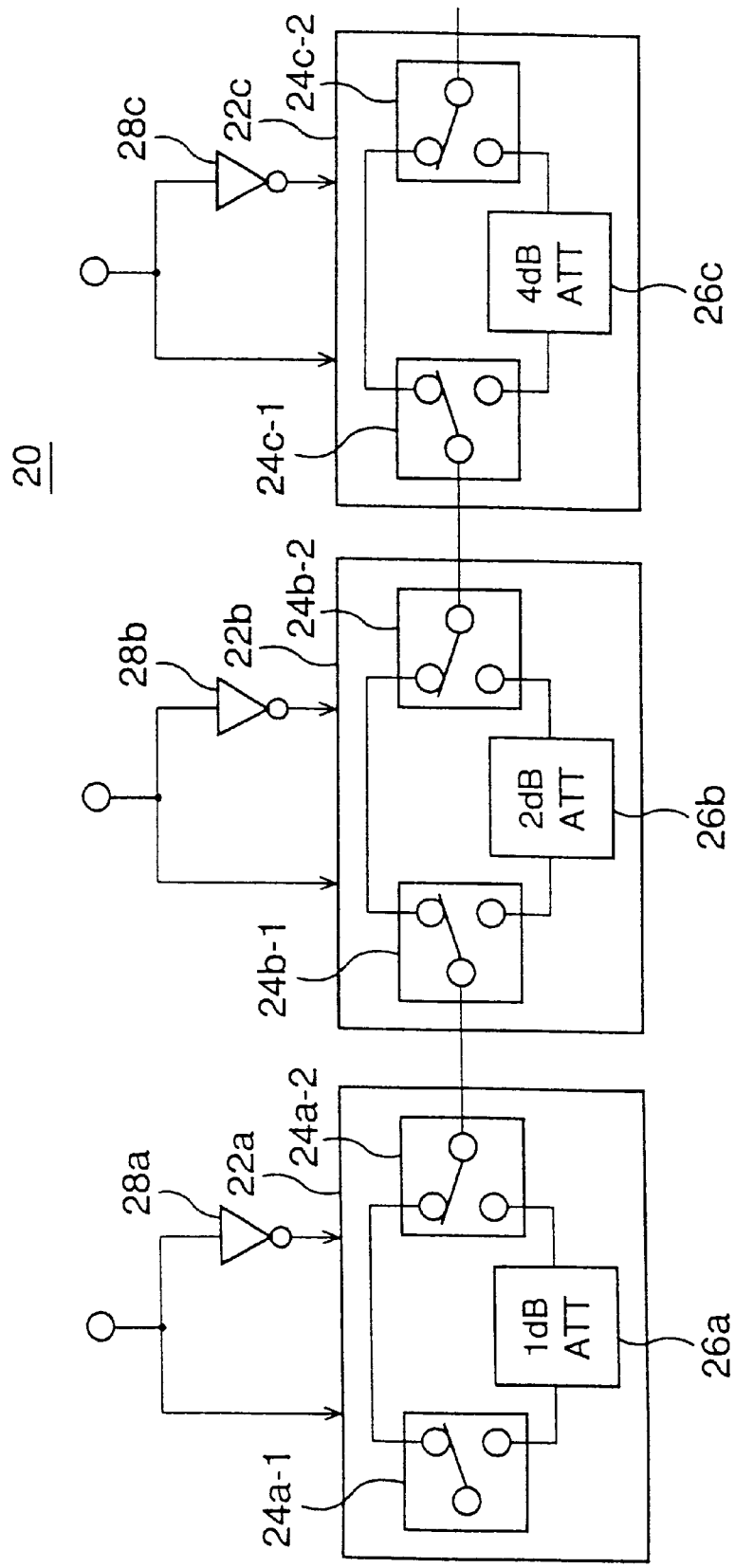
FIG. 2 shows a typical configuration of the step attenuator.
Figure 3:
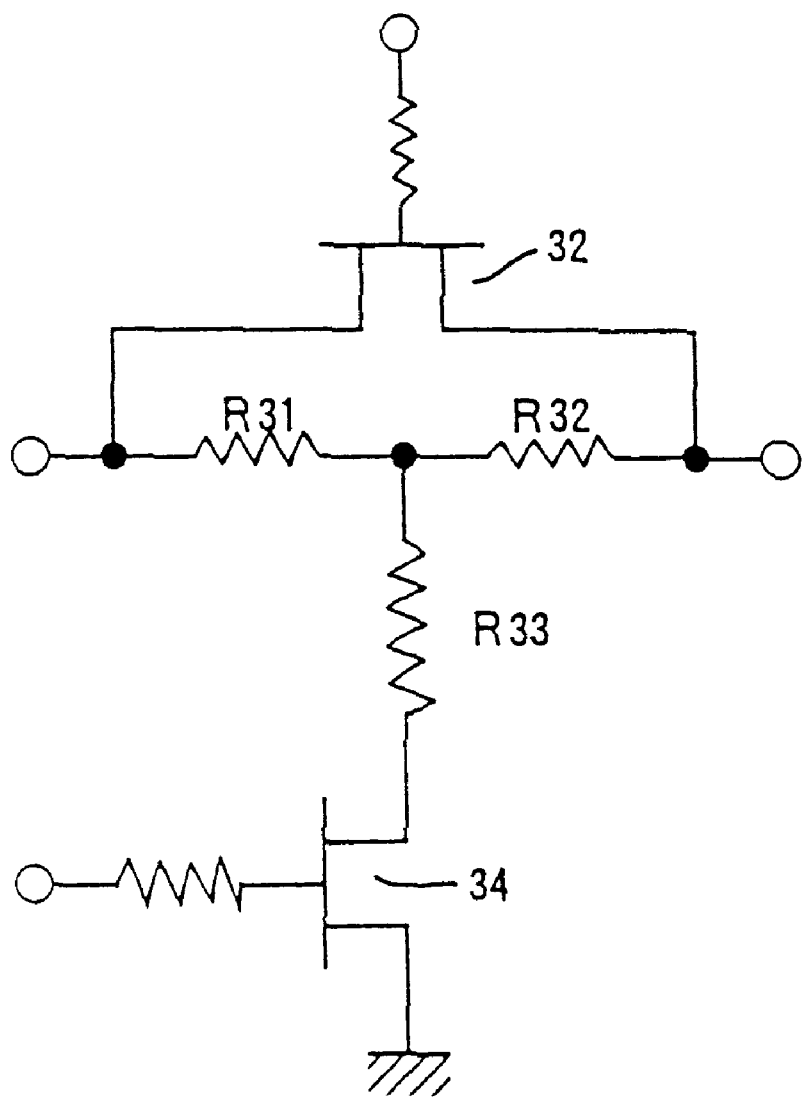
FIG. 3 shows a schematic diagram of a prior-art attenuator unit using a T-type attenuator.
Figure 4:
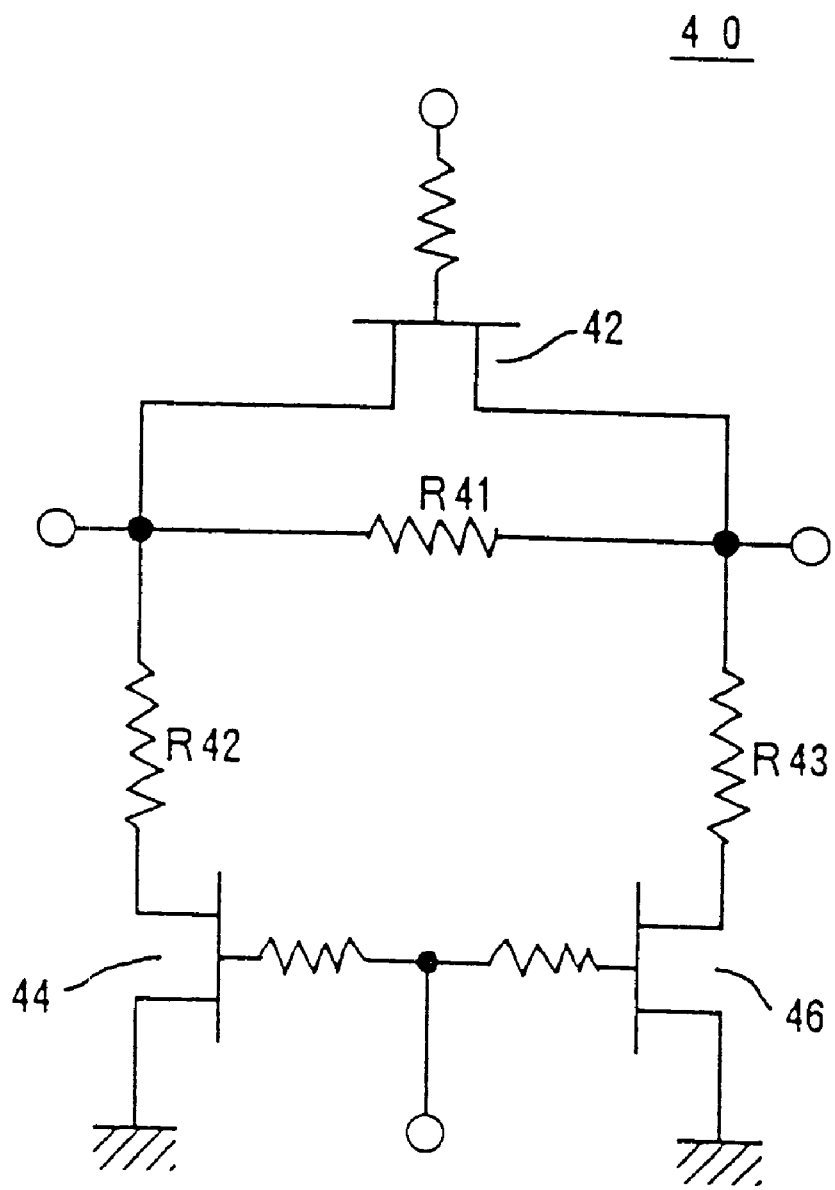
FIG. 4 shows a schematic diagram of a prior-art attenuator unit using a π-type attenuator.

In particular, in the attenuator unit 100 according to the present invention, the number of transistors in the shunt side is reduced by one as compared to the prior-art attenuator unit shown in FIG. 4. Therefore, the number of components and layout area for the attenuator unit may be reduced, and, thus, a simply-configured attenuator unit may be realized. Furthermore, since the two FETs in the shunt side of the prior-art attenuator unit 40 are replaced with a single FET in common, degradation of the frequency performance due to dispersion of the FET characteristics may be reduced.

In addition, when the attenuator unit 100 is produced by using an MMIC technique, because of reduction of a chip area for the attenuator unit 100, design cost may be reduced. Also, since the number of chips obtainable from one wafer increases, mass production of the attenuator unit becomes possible.

The above-discussed FET is operative as a resistor in an on condition, and operative as a capacitor in an off condition. A gate voltage when a drain current starts to flow, namely a pinch-off voltage, is, for example, −0.8 V. Therefore, as the gate voltage of the FET in its normal operation, a voltage apart from the pinch-off voltage, such as 0 V and −3 V, is applied.

However, when a voltage adjacent to the pinch-off voltage is applied to the gate of the FET, the FET operates with having characteristics of both the resistor and the capacitor. In this case, the attenuator unit may have an analog attenuation value according to the control voltage applied to the gate of the FET. Namely, when the control voltage is selected near the pinch-off voltage, the attenuator unit operates as a variable attenuator whose attenuation value can be continuously varied.

Figure 7:
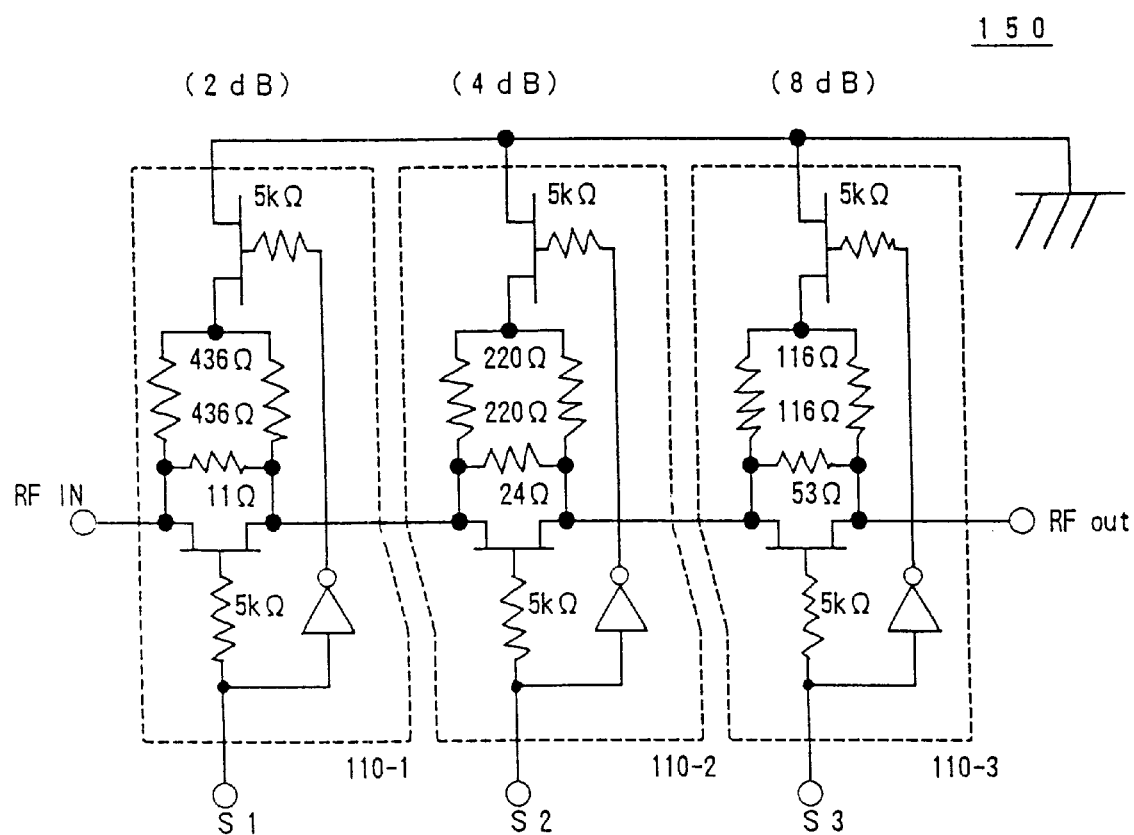
FIG. 7 shows a schematic diagram of a first embodiment of the step attenuator according to the present invention.

FIG. 7 shows a schematic diagram of the first embodiment of the step attenuator according to the present invention. A step attenuator 150 shown in FIG. 7 includes three attenuator units 110-1, 110-2, 110-3 which are connected in series. Each of these attenuator units 110-1, 110-2, 110-3 has the same configuration as that of the attenuator unit 110 shown in FIG. 6. Values of resistors in each attenuator unit are determined such that a fixed attenuation value of each attenuator unit has a given attenuation value.

For example, in the attenuator unit 110-1, with 11-Ω, 436-Ω, 436-Ω resistors, a π-type attenuator having a 2-dB attenuation value is constructed. In the same way, in the attenuator unit 110-2, with 24-Ω, 220-Ω, 220-Ω resistors, a π-type attenuator having a 4-dB attenuation value is constructed. In the attenuator unit 110-3, with 53-Ω, 116-Ω, 116-Ω resistors, a π-type attenuator having an 8-dB attenuation value is constructed.

FETs included in the attenuator units 110-1, 110-2, 110-3 are respectively controlled by external control signals S1, S2, S3. For example, when all the attenuator units are operated as attenuators by the external control signals S1, S2, S3, the step attenuator 150 may have an attenuation value of 14 dB. When only the attenuator unit 110-3 is operated as an attenuator, the step attenuator 150 may have an attenuation value of 8 dB. In this way, the attenuation value of the step attenuator 150 may be selected from 0 dB to 14 dB in a 2-dB step.

In the step attenuator using the attenuator unit according to the present invention, since each attenuator unit has a simple configuration, over all size of the step attenuator may be miniaturized and simplified. Further, since each attenuator unit has good frequency performance, the step attenuator according to the present invention may have better frequency performance than that of the step attenuator having the prior-art attenuator unit.

In the step attenuator 150 of the first embodiment, when each attenuator unit operates as an attenuator, and when a large power input signal is applied, the following problem may occur.

When the attenuator unit regularly operates, high-frequency power generated in the resistor of the shunt side is transferred to ground through the FET in the shunt side. However, when the power of the input signal increases and the high-frequency power increases, a part of the high-frequency power may not be transferred to ground, and may be transmitted to an output terminal through the other side resistor in the shunt side. Therefore, a desired attenuation value may not be obtained.

On the contrary, in the prior-art attenuator unit having the two FETs in the shunt side shown in FIG. 4, the high-frequency power generated in the one side resistor (for example, R42) of the shunt side does not flow into the other side resistor (for example, R43) of the shunt side. Therefore, in the prior-art attenuator unit, for the large high-frequency power, the desired attenuation value is substantially obtained.

In the following, a comparison of attenuation characteristics of the attenuator unit according to the present invention and the prior-art attenuator unit will be discussed.

Figure 8:
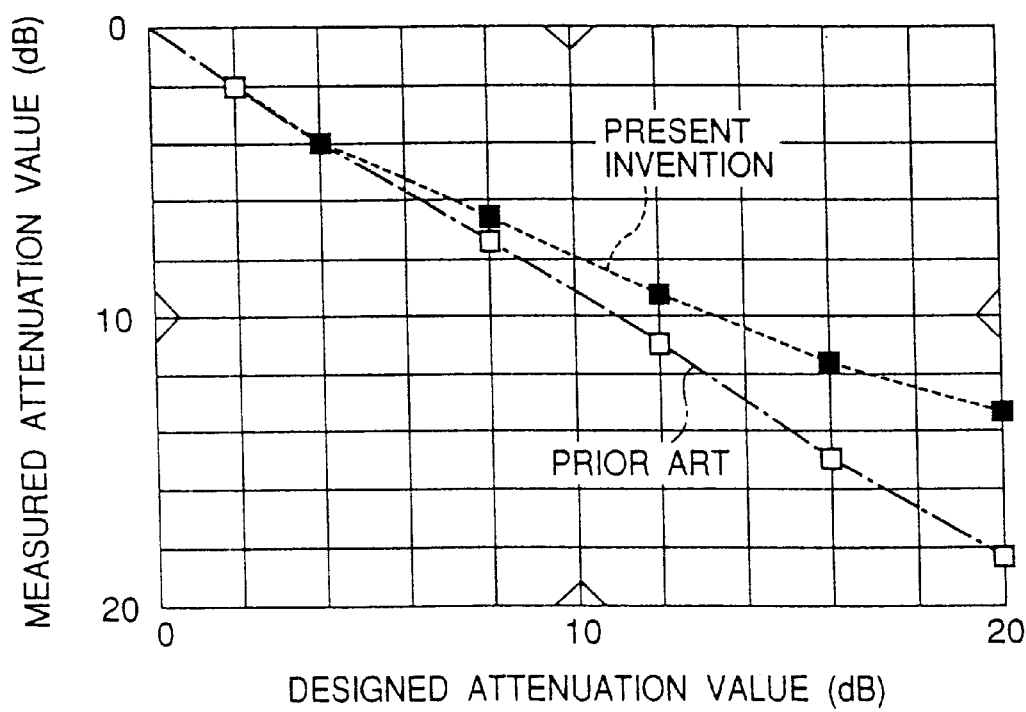
FIG. 8 shows attenuation characteristics of the attenuator unit according to the present invention shown in FIG. 6 and the prior-art attenuator unit shown in FIG. 4.

FIG. 8 shows attenuation characteristics of the attenuator unit according to the present invention shown in FIG. 6 and the prior-art attenuator unit shown in FIG. 4. The horizontal axis indicates a designed attenuation value, and the vertical axis indicates a measured attenuation value. In FIG. 8, under the designed attenuation value of 8 dB, in both the attenuator units, the same attenuation value as the designed attenuation value is measured. However, in the designed attenuation value of more than 10 dB, the measured attenuation value of the attenuator unit according to the present invention separates from the designed attenuation value.

On the other hand, in the prior-art attenuator unit, even in the designed attenuation value more than 10 dB, substantially the same attenuation value as the designed attenuation value is measured. In the prior-art attenuator unit, a difference between a theoretical value (the designed value) and the measured value seems to be due to a loss in the FET, etc.

As mentioned above, an example in FIG. 8 shows that, in the designed attenuation value less than 8 dB, the attenuator unit according to the present invention effectively operates. Therefore, by applying the attenuator unit according to the present invention to a part of the step attenuator using the prior-art attenuator unit, a smaller-sized step attenuator having good performance may be realized. Next, a configuration and operation of such a step attenuator will be discussed.

Figure 9:
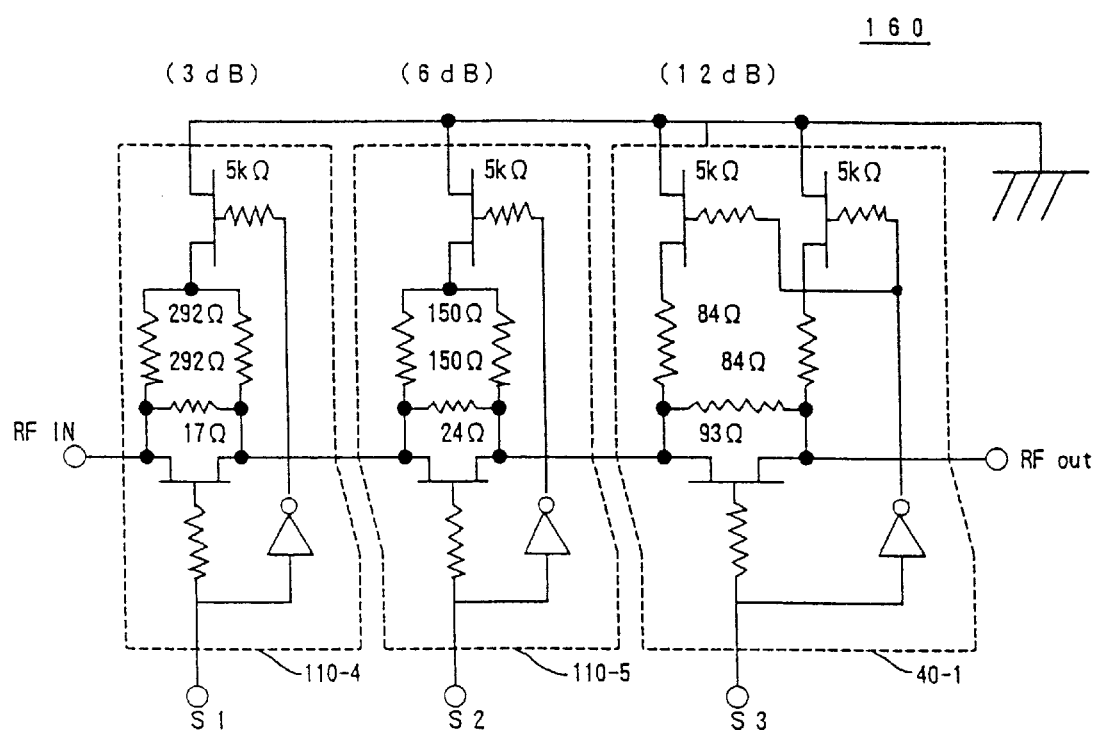
FIG. 9 shows a schematic diagram of a second embodiment of the step attenuator according to the present invention.

FIG. 9 shows a schematic diagram of a second embodiment of the step attenuator according to the present invention. A step attenuator 160 shown in FIG. 9 includes two attenuator units 110-4, 110-5, and an attenuator unit 40-1, which are connected in series. Each of the attenuator units 110-4, 110-5 has the same configuration as that of the attenuator unit 110 shown in FIG. 6. The attenuator unit 40-1 has the same configuration as that of the attenuator unit 40 shown in FIG. 4.

Values of resistors in each attenuator unit are determined such that a fixed attenuation value of each attenuator unit has a given attenuation value.

For example, in the attenuator unit 110-4, with 17-Ω, 292-Ω, 292-Ω resistors, a fixed attenuator having a 3-dB attenuation value is constructed. In the same way, in the attenuator unit 110-5, with 24-Ω, 150-Ω, 150-Ω resistors, a fixed attenuator having a 6-dB attenuation value is constructed. In the attenuator unit 40-1, with 93-Ω, 84-Ω, 84-Ω resistors, a fixed attenuator having a 12-dB attenuation value is constructed.

In the attenuator units 110-4, 110-5, the FET in the shunt side is designed such that when the FET is in a conductive condition, a resistance value of the FET is sufficiently small as compared to the resistance values (292 Ω, 150 Ω) of the resistors in the shunt side. Therefore, a total attenuation value of the step attenuator 160 may be selected from 0 dB to 21 dB in 3-dB steps.

Further, since the attenuator unit 40-1 is constructed with a π-type structure having two FETs in the shunt side, the attenuator unit 40-1 may have good attenuation performance even for a relatively large attenuation value.

In the step attenuator 160 according to the present invention, for the attenuator unit 40-1 having a relatively large attenuation value, for example, 12 dB, the prior-art attenuator unit as shown in FIG. 4 is used for obtaining good attenuation performance, and for the attenuator units 110-4, 110-5 having a relatively small attenuation value, for example, 3 dB and 6 dB, the attenuator units according to the present invention as shown in FIG. 6 are used for miniaturizing the step-attenuator size.

Therefore, the second embodiment of the step attenuator according to the present invention may be miniaturized and may have good attenuation performance even for a relatively large attenuation value.

Next, a description will be given of an inverter circuit according to the present invention.

Figure 10:
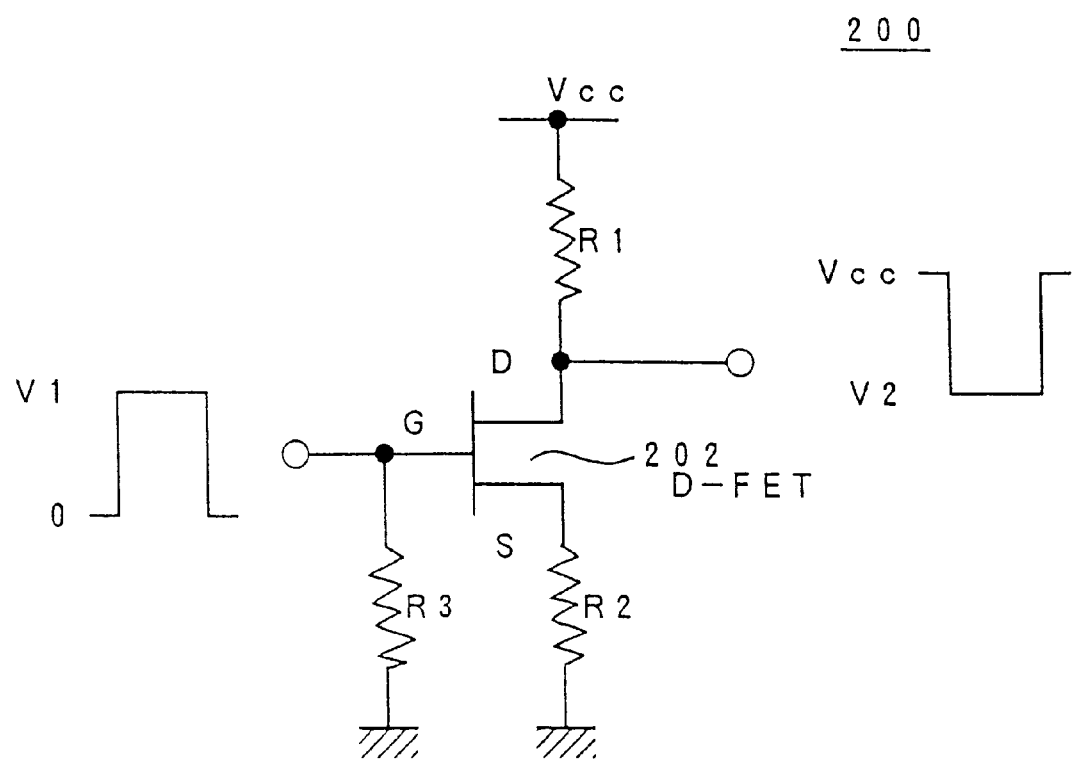
FIG. 10 shows a schematic diagram of a first embodiment of an inverter circuit according to the present invention.

FIG. 10 shows a schematic diagram of a first embodiment of the inverter circuit according to the present invention. An inverter circuit 200 shown in FIG. 10 includes a D-FET 202, and three resistors R1, R2, R3. The resistor R1 is connected between a drain of the D-FET 202 and a power-supply voltage Vcc, the resistor R2 is connected between a source of the D-FET 202 and ground, and the resistor R3 is connected between a gate of the D-FET 202 and the ground. A input signal is supplied to the gate of the D-FET 202.

In the inverter circuit 200, a resistance value of the resistor R2 is set to a value (absolute value of the pinch-off voltage/a current between the drain and the source), and a resistance value of the resistor R3 is set to be more than several kΩ.

When a given voltage is applied between the drain and the source, a current according to a gate width of the D-FET 202 flows into the resistor R2. Therefore, reverse electromotive force is generated across the resistor R2, and a negative voltage of the reverse electromotive force is applied to the resistor R3 to produce a self-bias. In this case, by selecting the resistance value of the resistor R2 so as to produce the same reverse electromotive force as the voltage supplied to the gate, the D-FET 202 may be operated in a pinch-off condition. In this way, a self-bias circuit is formed, and an operational point is set to be in the pinch-off condition.

As a result, when a 0-V voltage is applied to the gate of the D-FET 202, the D-FET 202 is turned off, and when a V1 voltage is applied to the gate, the D-FET 202 is turned on (V1 is a given voltage enabling the D-FET 202 to turn on).

Next, an output voltage Vout in this case will be discussed. In the following discussion, when the D-FET 202 is turned on, a resistance value of the D-FET 202 is referred to as Ron, and when the D-FET 202 is turned off, the resistance value thereof is referred to as Roff. When the input voltage is 0 V:

$$Vout = (R2 + Roff)/(R1 + R2 + Roff) \times Vcc$$

$$= (1 + R2/Roff)(1 + (R1 + R2)/Roff) \times Vcc$$

$$\approx Vcc, \text{ (where, } Roff \gg R1, R2\text{)}.$$

In this way, when the input voltage is 0 V, the output voltage Vout becomes Vcc. When the input voltage is V1:

$$Vout = (R2+Ron)/(R1+R2+Ron) \times Vcc.$$

Since a value (R2+Ron)/(R1+R2+Ron) is less than 1, when the input voltage is V1, the output voltage Vout becomes lower than Vcc (the output voltage Vout at that time is referred to as V2). In this case, the resistance value of the resistor R1 is determined so that the output voltage can be decided to be a logical low level.

In this way, from the drain of the D-FET 202, an inverted signal of the input signal supplied to the gate of the D-FET 202 may be obtained.

As mentioned above, even with the configuration having a single FET, the inverter circuit may be provided. Therefore, the inverter circuit 200 according to the present invention may be miniaturized as compared to the prior-art inverter circuit 50 having two FETs shown in FIG. 5. Further, inverter-circuit design may also be simplified, and, thus, inverter-circuit cost can be reduced.

Figure 11:
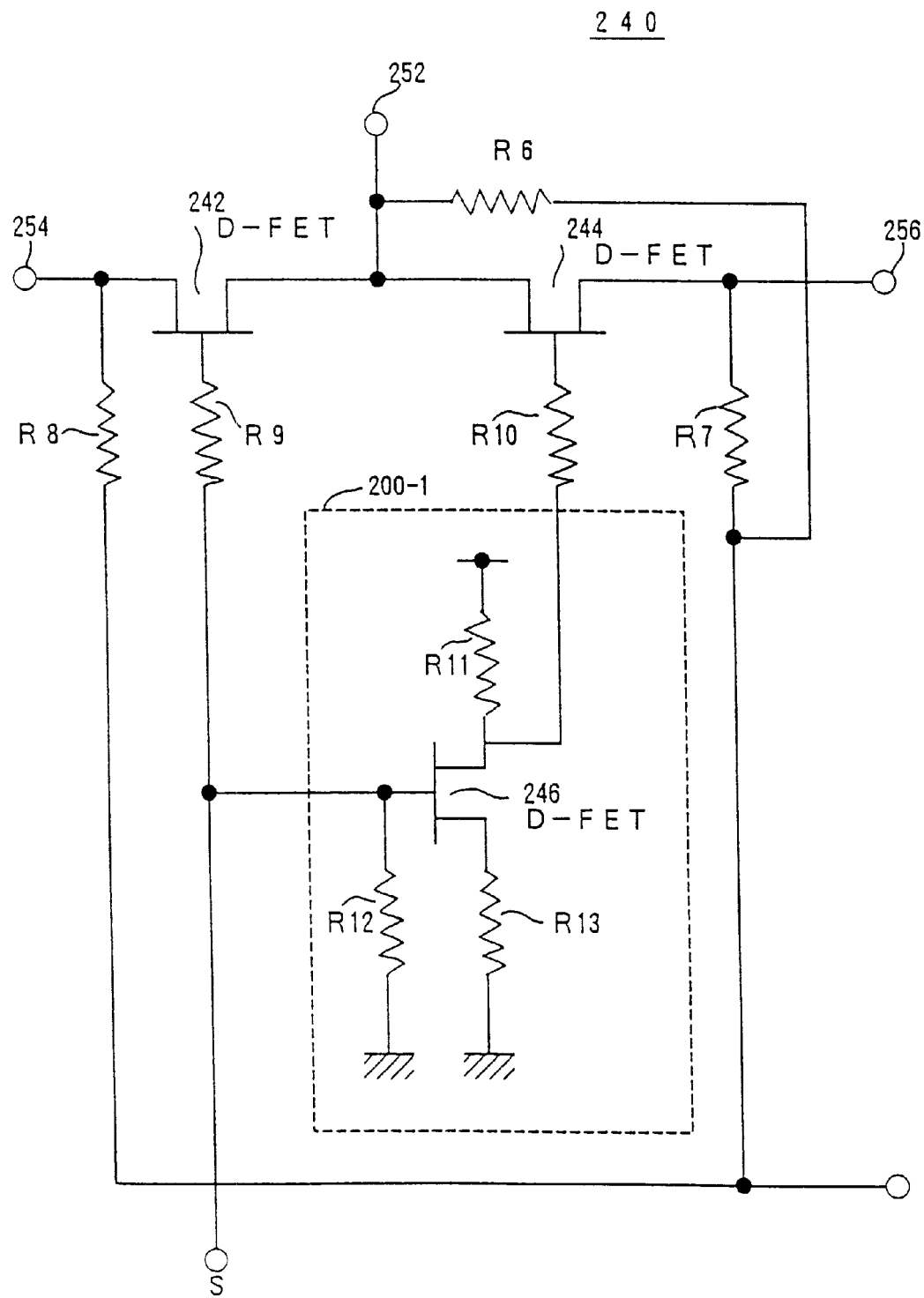
FIG. 11 shows a schematic diagram of an SPDT switch using the first embodiment of the inverter circuit according to the present invention.

FIG. 11 shows a schematic diagram of an SPDT switch using the first embodiment of the inverter circuit according to the present invention. An SPDT switch 240 shown in FIG. 11 includes two D-FETs 242, 244, and an inverter circuit 200-1. A control signal S is supplied to a gate of the D-FET 242, and an inverted signal, which is produced by the control signal S being inverted in the inverter circuit 200-1, is supplied to a gate of the D-FET 244.

In the SPDT switch 240, by the control signal S, one of signals supplied to terminals 254, 256 is transmitted to a terminal 252. Also, by the control signal, a signal supplied to the terminal 252 may be transmitted to one of the terminals 254, 256.

Since the SPDT switch 240 shown in FIG. 11 uses the inverter circuit 200-1 capable of being miniaturized and simplified, miniaturization and cost reduction of the SPDT switch may be realized.

Figure 12:
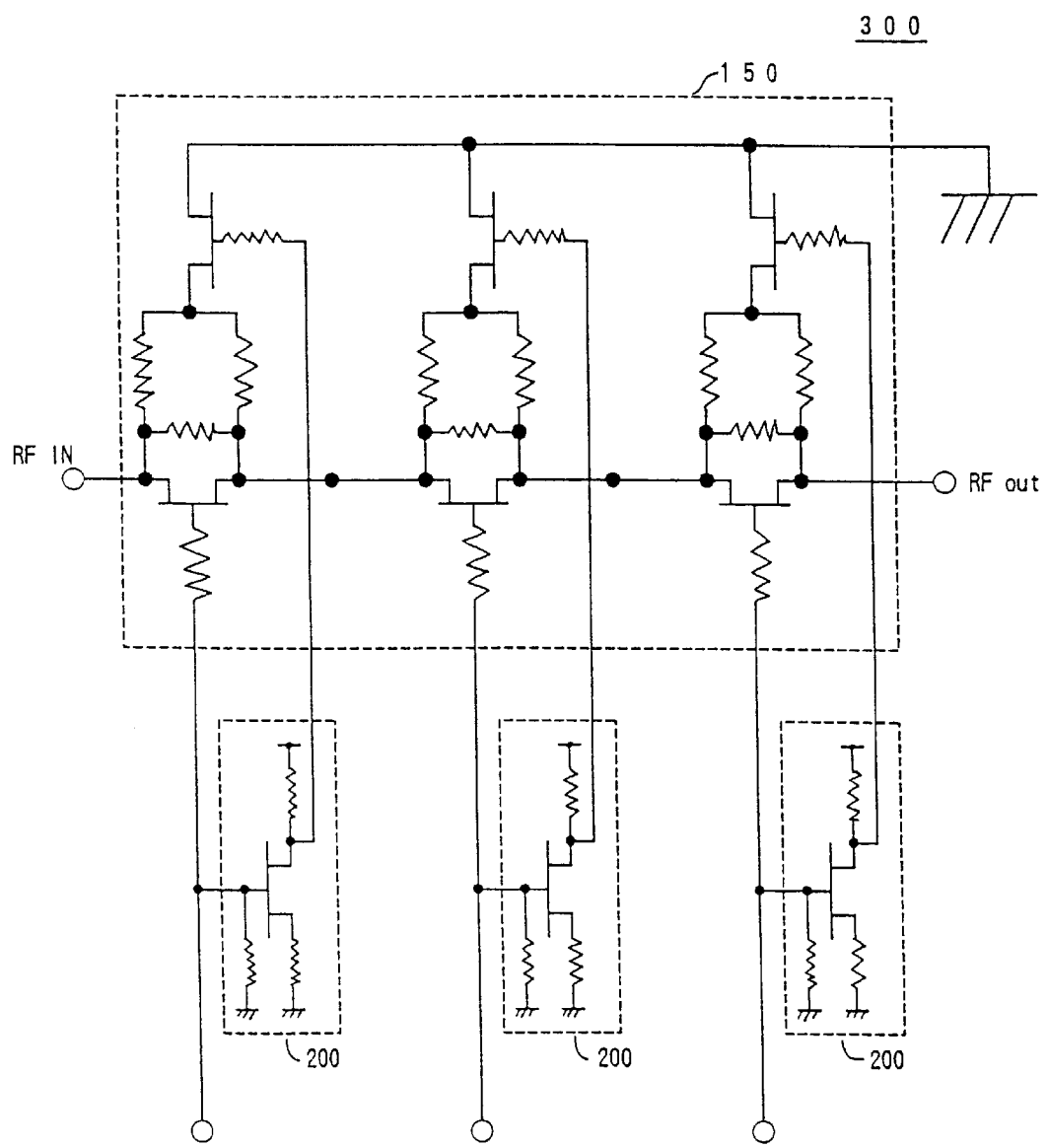
FIG. 12 shows a schematic diagram of a third embodiment of the step attenuator according to the present invention.

FIG. 12 shows a schematic diagram of a third embodiment of the step attenuator according to the present invention. The step attenuator 300 shown in FIG. 12 is constructed by applying the inverter circuit 200 shown in FIG. 10 to the step attenuator 150 shown in FIG. 7. The step attenuator 300 is operative in the same way as the step attenuator 150 shown in FIG. 7.

Figure 5:
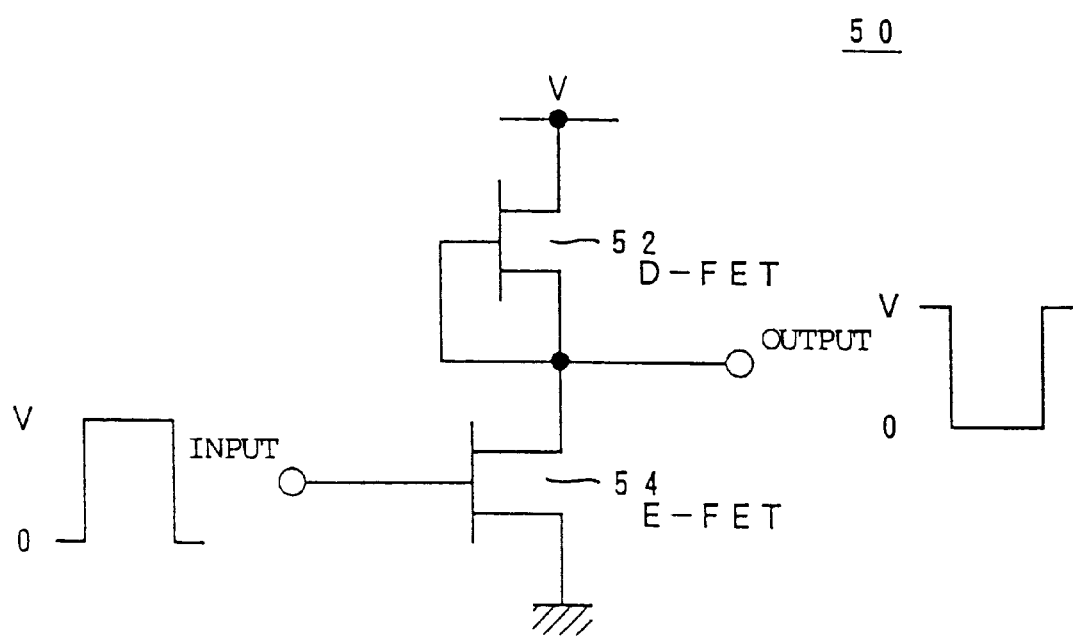
FIG. 5 shows a schematic diagram of a prior-art inverter circuit.

In the step attenuator 300, the number of transistors required for the attenuator unit may be reduced as compared to the prior-art attenuator unit shown in FIG. 4, and the number of transistors required for the inverter circuit may also be reduced as compared to the prior-art inverter circuit shown in FIG. 5. Therefore, since the step attenuator 300 uses smaller-sized and further simplified attenuator units and inverter circuits, the step attenuator 300 may further be miniaturized and simplified as compared to the prior-art step attenuator.

Further, since the attenuator unit and the inverter circuit in the step attenuator 300 has good frequency performance, the step attenuator 300 may have better frequency performance as compared to the step attenuator having the prior-art attenuator unit and the prior-art inverter circuit.

Figure 13:
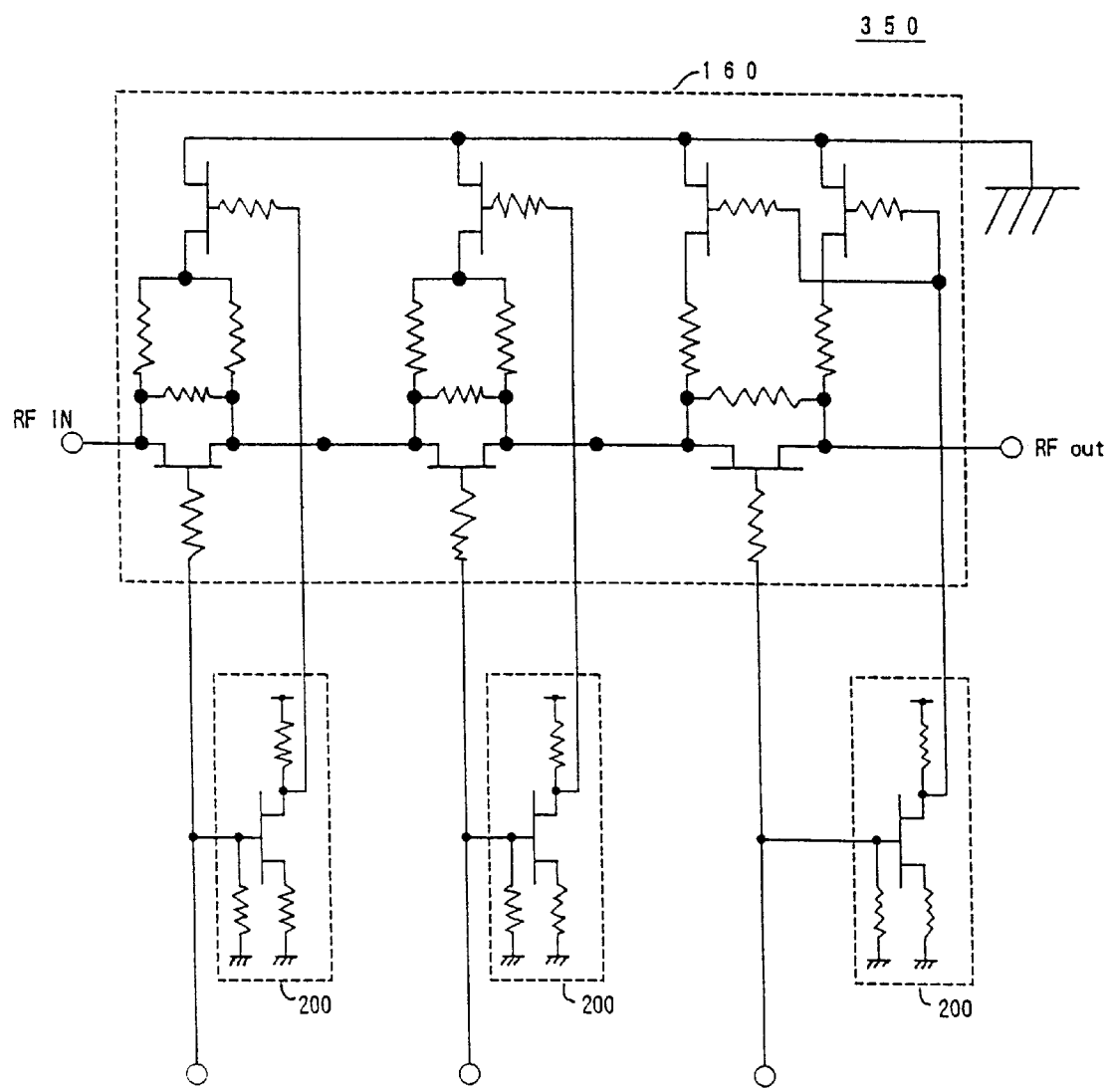
FIG. 13 shows a schematic diagram of a fourth embodiment of the step attenuator according to the present invention.

FIG. 13 shows a schematic diagram of a fourth embodiment of the step attenuator according to the present invention. A step attenuator 350 shown in FIG. 13 is constructed by applying the inverter circuit 200 shown in FIG. 10 to the step attenuator 160 shown in FIG. 9. The step attenuator 350 is operative in the same way as the step attenuator 160 shown in FIG. 9.

In the step attenuator 350, the number of transistors required for the attenuator unit may be reduced as compared to the prior-art attenuator unit shown in FIG. 4, and the number of transistors required for the inverter circuit may also be reduced as compared to the prior-art inverter circuit shown in FIG. 5. In this way, since the step attenuator 350 uses smaller-sized and further simplified attenuator units and inverter circuits, the step attenuator 350 may further be miniaturized and simplified as compared to the prior-art step attenuator.

Further, in the step attenuator 350, for obtaining a relatively large attenuation value, the prior-art attenuator unit having good attenuation performance even for the large attenuation value is used. Therefore, the step attenuator 350 may have good attenuation performance even for obtaining the large attenuation value.

Next, descriptions will be given of applications of the step attenuator according to the present invention.

A first example where the step attenuator according to the present invention is applied to radio equipment will be discussed by referring to FIG. 14.

Figure 14:
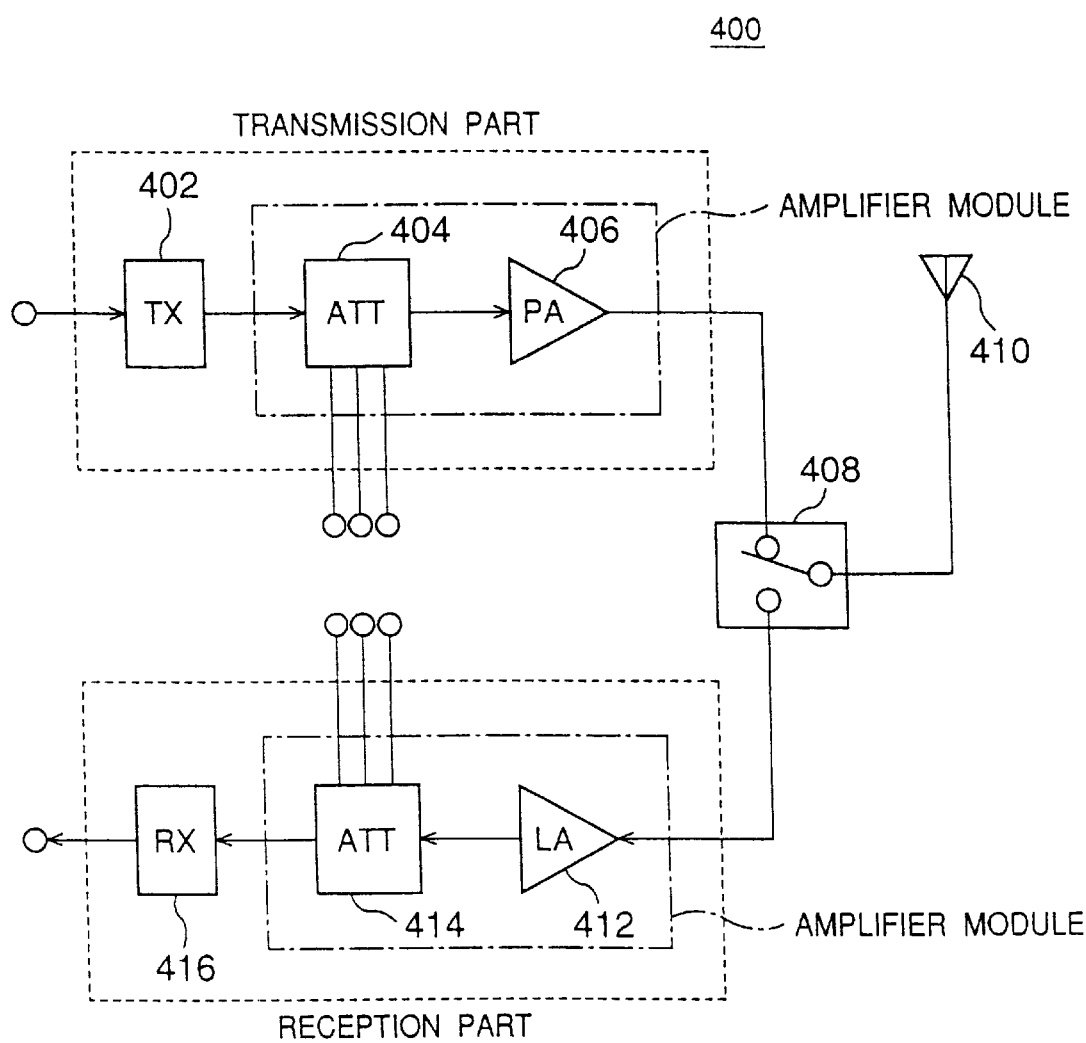
FIG. 14 shows a block diagram of radio equipment according to the present invention.

FIG. 14 shows a block diagram of the radio equipment according to the present invention. Radio equipment shown in FIG. 14 comprises a transmission part and a reception part. The transmission part includes a transmission circuit 402, a step attenuator 404, and a power amplifier 406. The reception part includes a low-noise amplifier 412, a step attenuator 414, and a reception circuit 416. To the step attenuators 404, 414, either of the above-mentioned step attenuators according to the present invention may be applied.

The step attenuator 404 can attenuate a transmission signal by a given attenuation step to reduce interference caused by a large-strength transmission signal. The step attenuator 414 can attenuate a received signal by a given attenuation step to prevent the reception circuit 416 from being saturated due to a large-strength received signal.

In the radio equipment 400, the transmission part and the reception part may be manufactured by using the MMIC technique. Further, with the step attenuator 404 and the power amplifier 406, a transmission amplifier module can be constituted, and with the step attenuator 414 and the low-noise amplifier 412, a reception amplifier module can be provided. In this case, these amplifier modules may further be miniaturized.

In the above example of the radio equipment, the step attenuator 414 is positioned in the following stage of the low-noise amplifier 412 to prevent an increase of a noise figure. However, the step attenuator 414 may be positioned in the previous stage of the low-noise amplifier 412 from a standpoint of preventing an over-power input.

In this way, miniaturization and cost reduction of the radio equipment 400 may be easily performed by using the step attenuator according to the present invention.

A second example where the step attenuator according to the present invention is applied to a wireless card will be discussed by referring to FIG. 15 and FIG. 16.

Figure 15:
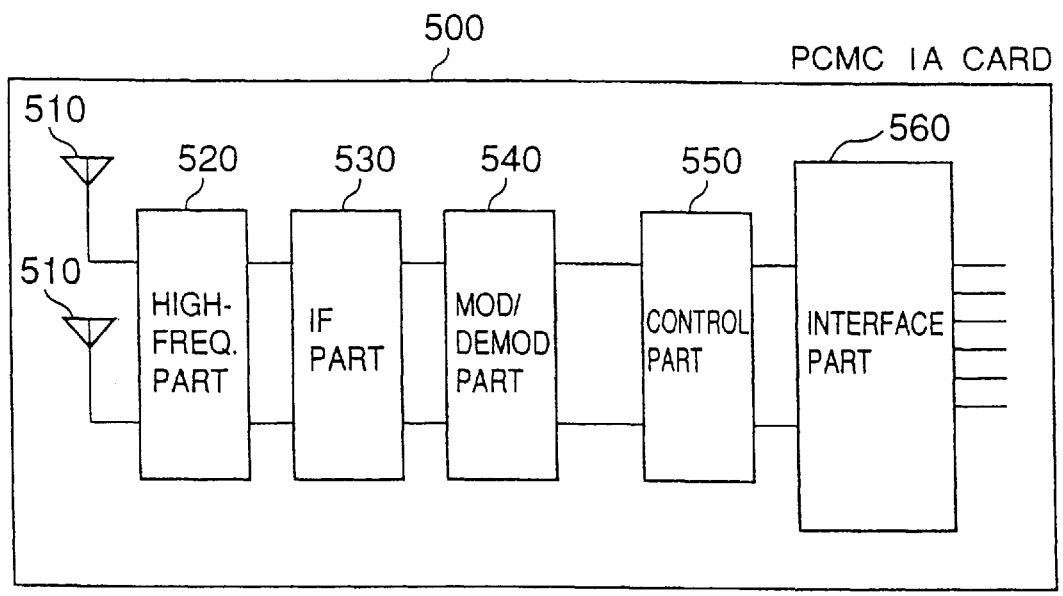
FIG. 15 shows a block diagram of a wireless card according to the present invention.
Figure 16:
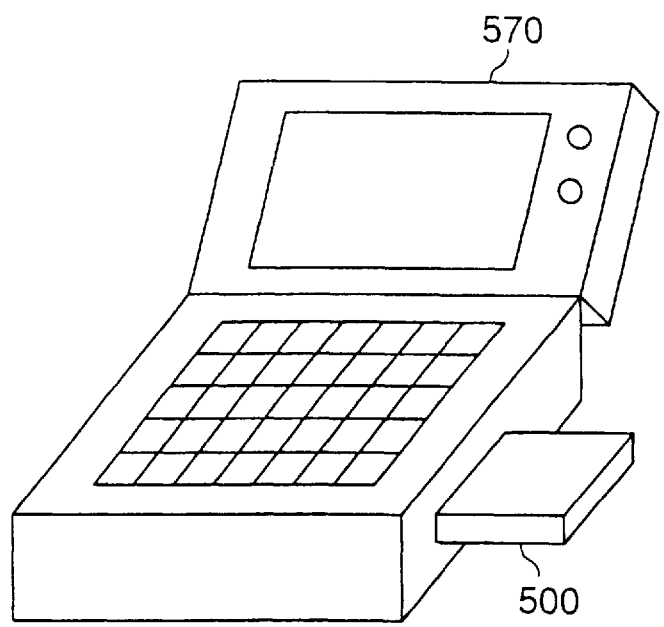
FIG. 16 shows an application example of the wireless card shown in FIG. 15.

FIG. 15 shows a block diagram of the wireless card according to the present invention. FIG. 16 shows an application example of the wireless card shown in FIG. 15. A wireless card 500 shown in FIG. 15 comprises an antenna 510, a high-frequency part 520, an intermediate-frequency (IF) part 530, a modulation-and-demodulation (MOD/DEMOD) part 540, a control part 550, and an interface part 560. The high-frequency part 520 includes either of the above-discussed step attenuators according to the present invention in a high-frequency signal path.

The wireless card 500 shown in FIG. 15 may be comprises, for example, a personal computer memory card international association (PCMCIA) card. As shown in FIG. 16, this wireless card 500 can be inserted to a personal computer 570, and may be used as a spread-spectrum (SS) wireless LAN card. In this case, through the personal computer 570 and the wireless LAN card 500, it is possible to communicate with another personal computer or a host computer.

Since the wireless card according to the present invention uses the step attenuator as shown in FIG. 7, FIG. 9, FIG. 12 and FIG. 13, miniaturization of the wireless card may easily be performed. Therefore, in the personal computer, space required for the wireless card to be inserted may be reduced, and, thus, a smaller-sized personal computer capable of supporting the wireless card may be realized.

Further, the present invention is not limited to these embodiments, but other variations and modifications may be made without departing from the scope of the present invention.

What is claimed is:

1. A step attenuator for attenuating a signal, having a plurality of attenuator units connected in series, at least one of said plurality of attenuator units comprising:

a π-type attenuator having a first resistor and second and third resistors which are arranged on both sides of said first resistor, said first, second and third resistors respectively having resistance values which control a current flowing in said second transistor to have a current value sufficient to operate said π-type attenuator;

a first transistor connected in parallel with said first resistor; and a second transistor connected between a joint node of said second resistor and said third resistor and a first voltage level;

wherein by controlling a gate voltage of said first transistor and a gate voltage of said second transistor, an attenuation value of said attenuator unit is changed.

2. The step attenuator as claimed in claim 1, wherein at least one of said plurality of attenuator units further comprises an inverter circuit providing a control signal which controls one of said gate voltage of said first transistor and said gate voltage of said second transistor, said inverter circuit including:

a first depletion-type FET (D-FET);

a fourth resistor connected between a drain of said first D-FET and a first power-supply voltage;

a fifth resistor connected between a source of said first D-FET and a ground; and a sixth resistor connected between a gate of said first D-FET and said second power-supply voltage;

wherein said control signal supplied to said gate of said first D-FET is inverted, and an inverted control signal is produced from said drain of said first D-FET.

3. A step attenuator for attenuating a signal, having at least one first attenuator unit and at least one second attenuator unit, said first attenuator unit comprising:

a first π-type attenuator having a first resistor and second and third resistors which are arranged on both sides of said first resistor;

a first transistor connected in parallel with said first resistor; and a second transistor connected between a joint node of said second resistor and said third resistor and a first voltage level;

wherein by controlling a gate voltage of said first transistor and a gate voltage of said second transistor, a first attenuation value of said first attenuator unit is changed; and said second attenuator unit comprising:

a second π-type attenuator having a fourth resistor and fifth and sixth resistors which are arranged on both sides of said fourth resistor;

a third transistor connected in parallel with said fourth resistor;

a fourth transistor connected between said fifth resistor and said first voltage level; and a fifth transistor connected between said sixth resistor and said first voltage level;

wherein:

by controlling a gate voltage of said third transistor, a gate voltage of said fourth transistor, and a gate voltage of said fifth transistor, a second attenuation value of said second attenuator unit is changed; and said first attenuation value of the first attenuator unit is less than said second attenuation value of said second attenuator unit.

4. The step attenuator as claimed in claim 3, wherein said step attenuator further comprises an inverter circuit providing a control signal which controls at least one of said gate voltage of said first transistor, said gate voltage of said second transistor, said gate voltage of said third transistor, said gate voltage of said fourth transistor, and said gate voltage of said fifth transistor, said inverter circuit including:

a first depletion-type FET (D-FET);

a first resistor connected between a drain of said first D-FET and a first power-supply voltage;

a second resistor connected between a source of said first D-FET and a ground; and a third resistor connected between a gate of said first D-FET and said second power-supply voltage;

wherein said control signal supplied to said gate of the first D-FET is inverted, and an inverted control signal is produced from said drain of said first D-FET.

5. An amplifier module having a step attenuator attenuating a signal and an amplifier connected to said step attenuator, said step attenuator including a plurality of attenuator units connected in series, at least one of said plurality of attenuator units comprising:

a π-type attenuator having a first resistor and second and third resistors which are arranged on both sides of said first resistor, said first, second and third resistors respectively having resistance values which control a current flowing in said second transistor to have a current value sufficient to operate said π-type attenuator;

a first transistor connected in parallel with said first resistor; and a second transistor connected between a joint node of said second resistor and said third resistor and a first voltage level;

wherein by controlling a gate voltage of said first transistor and a gate voltage of said second transistor, an attenuation value of said attenuator unit is changed.

6. An amplifier module having a step attenuator attenuating a signal and an amplifier connected to said step attenuator, said step attenuator including at least one first attenuator unit and at least one second attenuator unit, said first attenuator unit comprising:

a first π-type attenuator having a first resistor and second and third resistors which are arranged on both sides of said first resistor;

a first transistor connected in parallel with said first resistor; and a second transistor connected between a joint node of said second resistor and said third resistor and a first voltage level;

wherein by controlling a gate voltage of said first transistor and a gate voltage of said second transistor, a first attenuation value of said first attenuator unit is changed; and said second attenuator unit comprising:

a second π-type attenuator having a fourth resistor and fifth and sixth resistors which are arranged on both sides of said fourth resistor;

a third transistor connected in parallel with said fourth resistor;

a fourth transistor connected between said fifth resistor and said first voltage level; and a fifth transistor connected between said sixth resistor and said first voltage level;

wherein:

by controlling a gate voltage of said third transistor, a gate voltage of said fourth transistor, and a gate voltage of said fifth transistor, a second attenuation value of said second attenuator unit is changed; and said first attenuation value of the first attenuator unit is less than said second attenuation value of said second attenuator unit.

7. A transmitter module having a transmission circuit for producing a transmission signal, a step attenuator attenuating said transmission signal and an amplifier amplifying said transmission signal transmitted from said step attenuator, said step attenuator including a plurality of attenuator units connected in series, at least one of said plurality of attenuator units comprising:

a π-type attenuator having a first resistor and second and third resistors which are arranged on both sides of said first resistor, said first, second and third resistors respectively having resistance values which control a current flowing in said second transistor to have a current value sufficient to operate said π-type attenuator;

a first transistor connected in parallel with said first resistor; and a second transistor connected between a joint node of said second resistor and said third resistor and a first voltage level;

wherein by controlling a gate voltage of said first transistor and a gate voltage of said second transistor, an attenuation value of said attenuator unit is changed.

8. A transmitter module having a transmission circuit for producing a transmission signal, a step attenuator attenuating said transmission signal and an amplifier amplifying said transmission signal transmitted from said step attenuator, said step attenuator including at least one first attenuator unit and at least one second attenuator unit, said first attenuator unit comprising:

a first π-type attenuator having a first resistor and second and third resistors which are arranged on both sides of said first resistor;

a first transistor connected in parallel with said first resistor; and a second transistor connected between a joint node of said second resistor and said third resistor and a first voltage level;

wherein by controlling a gate voltage of said first transistor and a gate voltage of said second transistor, a first attenuation value of said first attenuator unit is changed; and said second attenuator unit comprising:

a second π-type attenuator having a fourth resistor and fifth and sixth resistors which are arranged on both sides of said fourth resistor;

a third transistor connected in parallel with said fourth resistor;

a fourth transistor connected between said fifth resistor and said first voltage level; and a fifth transistor connected between said sixth resistor and said first voltage level;

wherein:

by controlling a gate voltage of said third transistor, a gate voltage of said fourth transistor, and a gate voltage of said fifth transistor, a second attenuation value of said second attenuator unit is changed; and said first attenuation value of said first attenuator unit is less than said second attenuation value of said second attenuator unit.

9. A receiver module having a step attenuator attenuating a received signal, a reception amplifier, and a reception circuit receiving an amplified received signal, said step attenuator including a plurality of attenuator units connected in series, at least one of said plurality of attenuator units comprising:

a π-type attenuator having a first resistor and second and third resistors which are arranged on both sides of said first resistor, said first, second and third resistors respectively having resistance values which control a current flowing in said second transistor to have a current value sufficient to operate said π-type attenuator;

a first transistor connected in parallel with said first resistor; and a second transistor connected between a joint node of said second resistor and said third resistor and a first voltage level;

wherein by controlling a gate voltage of said first transistor and a gate voltage of said second transistor, an attenuation value of said attenuator unit is changed.

10. A receiver module having a step attenuator attenuating a received signal, a reception amplifier, and a reception circuit receiving an amplified received signal, said step attenuator including at least one first attenuator unit and at least one second attenuator unit, said first attenuator unit comprising:

a first π-type attenuator having a first resistor and second and third resistors which are arranged on both sides of said first resistor;

a first transistor connected in parallel with said first resistor; and a second transistor connected between a joint node of said second resistor and said third resistor and a first voltage level;

wherein by controlling a gate voltage of said first transistor and a gate voltage of said second transistor, a first attenuation value of said first attenuator unit is changed; and said second attenuator unit comprising:

a second π-type attenuator having a fourth resistor and fifth and sixth resistors which are arranged on both sides of said fourth resistor;

a third transistor connected in parallel with said fourth resistor;

a fourth transistor connected between said fifth resistor and said first voltage level; and a fifth transistor connected between said sixth resistor and said first voltage level;

wherein:

by controlling a gate voltage of said third transistor, a gate voltage of said fourth transistor, and a gate voltage of said fifth transistor, a second attenuation value of said second attenuator unit is changed; and said first attenuation value of said first attenuator unit is less than said second attenuation value of said second attenuator unit.

11. A wireless card including a data processing part for processing data, a modulation-and-demodulation part, a high-frequency part having a transmission circuit and a reception circuit and at least one step attenuator, and an antenna, said wireless card being provided to a data processing apparatus to communicate said data with another apparatus, said step attenuator including a plurality of attenuator units connected in series, at least one of said plurality of attenuator units comprising:

a π-type attenuator having a first resistor and second and third resistors arranged on both sides of said first resistor, said first, second and third resistors respectively having resistance values which control a current flowing in said second transistor to have a current value sufficient to operate said π-type attenuator;

a first transistor connected in parallel with said first resistor; and a second transistor connected between a joint node of said second resistor and said third resistor and a first voltage level;

wherein by controlling a gate voltage of said first transistor and a gate voltage of said second transistor, an attenuation value of said attenuator unit is changed.

12. A wireless card including a data processing part for processing data, a modulation-and-demodulation part, a high-frequency part having a transmission circuit and a reception circuit and at least one step attenuator, and an antenna, said wireless card being provided to a data processing apparatus to communicate said data with another apparatus, said step attenuator including at least one first attenuator unit and at least one second attenuator unit, said first attenuator unit comprising:

a first π-type attenuator having a first resistor and second and third resistors arranged on both sides of said first resistor;

a first transistor connected in parallel with said first resistor; and a second transistor connected between a joint node of said second resistor and said third resistor and a first voltage level;

wherein by controlling a gate voltage of said first transistor and a gate voltage of said second transistor, a first attenuation value of said first attenuator unit is changed; and said second attenuator unit comprising:

a second π-type attenuator having a fourth resistor and fifth and sixth resistors arranged on both sides of said fourth resistor;

a third transistor connected in parallel with said fourth resistor;

a fourth transistor connected between said fifth resistor and said first voltage level; and a fifth transistor connected between said sixth resistor and said first voltage level;

wherein:

by controlling a gate voltage of said third transistor, a gate voltage of said fourth transistor, and a gate voltage of said fifth transistor, a second attenuation value of said second attenuator unit is changed; and said first attenuation value of said first attenuator unit is less than said second attenuation value of said second attenuator unit.

\* \* \* \* \*